United States Patent [19]
Higashiguchi et al.

[11] Patent Number: 6,023,098
[45] Date of Patent: *Feb. 8, 2000

[54] SEMICONDUCTOR DEVICE HAVING TERMINALS FOR HEAT RADIATION

[75] Inventors: Yutaka Higashiguchi; Mitsuo Inagaki; Toshio Kumai; Ryoichi Ochiai; Makoto Totani, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/591,732

[22] Filed: Jan. 25, 1996

[30] Foreign Application Priority Data

Jun. 29, 1995 [JP] Japan ..................................... 7-164224

[51] Int. Cl.⁷ ................................................... H01L 23/34
[52] U.S. Cl. ........................................... 257/712; 257/717
[58] Field of Search .................................. 257/700, 707, 257/712, 720, 717

[56] References Cited

U.S. PATENT DOCUMENTS

| 5,012,386 | 4/1991 | McShane et al. | 361/386 |
| 5,043,794 | 8/1991 | Tai et al. | 357/74 |
| 5,102,829 | 4/1992 | Cohn | 437/217 |
| 5,473,512 | 12/1995 | Pegami et al. | 361/760 |
| 5,506,755 | 4/1996 | Miyagi et al. | 361/720 |
| 5,543,661 | 8/1996 | Sumida | 257/707 |
| 5,583,378 | 12/1996 | Marrs et al. | 257/718 |
| 5,629,835 | 5/1997 | Mahulikar et al. | 361/719 |
| 5,640,047 | 6/1997 | Nakashima | 257/738 |
| 5,640,048 | 6/1997 | Selna | 257/738 |

FOREIGN PATENT DOCUMENTS

| 0066842 | 4/1985 | Japan | 257/705 |
| 61-137350 | 6/1986 | Japan . | |
| 3-082148 | 4/1991 | Japan . | |

Primary Examiner—John Guay
Attorney, Agent, or Firm—Staas & Halsey, L.L.P.

[57] ABSTRACT

A semiconductor device includes a wiring board, an electronic component supported by the wiring board, a heat conduction layer provided in the wiring board so as to be in contact with the electronic component, and terminals provided on the wiring board and thermally connected to the heat conduction layer through thermal vias provided in the wiring board. Heat generated by the electronic component conducts to the terminals through the heat conduction layer and then conducts to a circuit board on which the semiconductor device is placed.

12 Claims, 7 Drawing Sheets

SEMICONDUCTOR DEVICE HAVING TERMINALS FOR HEAT RADIATION

BACKGROUND OF THE INVENTION

1. Field of the Invention

The present invention generally relates to a semiconductor device in which electronic components such as semiconductor chips are supported by a wiring board, and more particularly to a semiconductor device having projection electrodes such as electrodes of a ball grid array type (hereinafter simply referred to as BGA type).

Recently, the integration density of semiconductor chips has been drastically increased and it has been required to increase the mounting density of semiconductor devices.

Under the above situation, there has been considerable activity in the development of BGA type semiconductor devices, which has advantages in which electrodes (terminals) for external connections can be arranged on the back surfaces of the semiconductor devices at a relatively wide pitch and are hardly deformed. These advantages are attractive as compared to QFP type semiconductor devices. However, recently it has been required, as the integration density of the semiconductor chips has been increased and the amount of heat radiated therefrom has thus been increased, to provide BGA type semiconductor devices having a structure enabling more effective and efficient heat radiating performance.

2. Description of the Related Art

Figure 1:
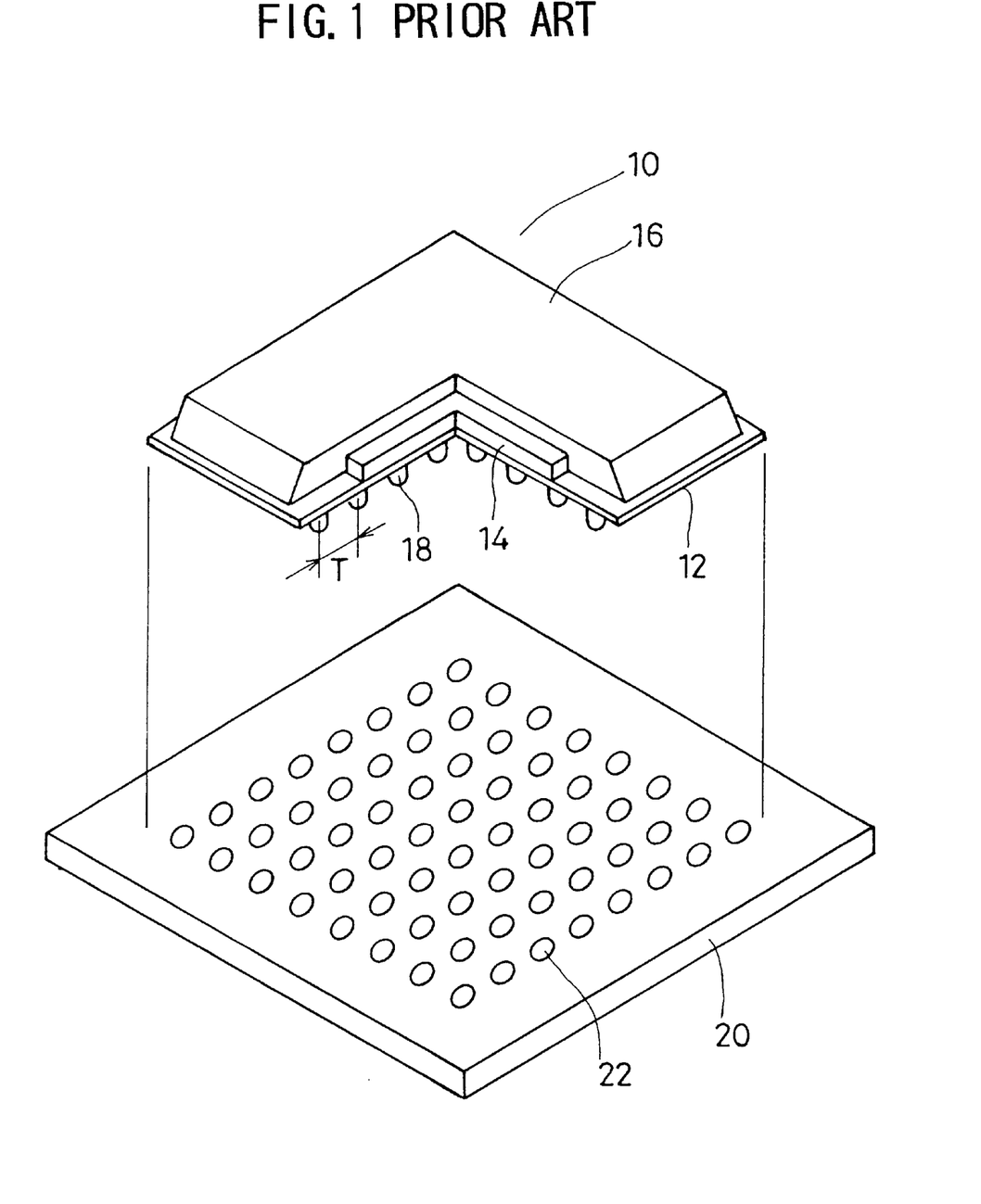
FIG. 1 is a perspective view of a conventional semiconductor device.

FIG. 1 is a perspective view of a conventional BGA type semiconductor device. A BGA type 10 shown in FIG. 1 is a semiconductor chip (an LSI chip) 14, which is a bare chip, a sealing part 16, and SnPb solder bumps 18 having a ball shape. Electrodes (not shown) provided on the semiconductor chip 14 and electrodes provided on the front surface of the wiring board 12 are bonded together by wires. The electrodes provided on the wiring board 12 and the solder bumps 18 provided on the back surface of the wiring board 12 are electrically connected together through wiring layers and via holes formed inside the wiring board 12. The surfaces of the semiconductor chip 14 and the wiring board 12 are sealed by the sealing part 16 made of resin. The solder bumps 18 function as terminals (electrodes) for external connections, and are arranged on the back surface of the wiring board 12 in a matrix formation. Generally, the interval T between the adjacent solder bumps 18 is equal to or less than 1.5 mm.

The BGA type semiconductor device 10 can be mounted on a mother board 20, which may be a glass-epoxy resin board. On the mother board 20, there are provided electrodes 22 arranged in a matrix formation and wiring lines. The semiconductor bumps 18 can be soldered to the electrodes 20 on the mother board 20 in a state in which the bumps 18 are in contact with the electrodes 20.

As described above, the semiconductor chip generates an increased amount of heat as the integration density thereof is increased. Hence, it is required to provide BGA type semiconductor devices having a structure that enables effective and efficient heat radiating performance.

Figure 2:
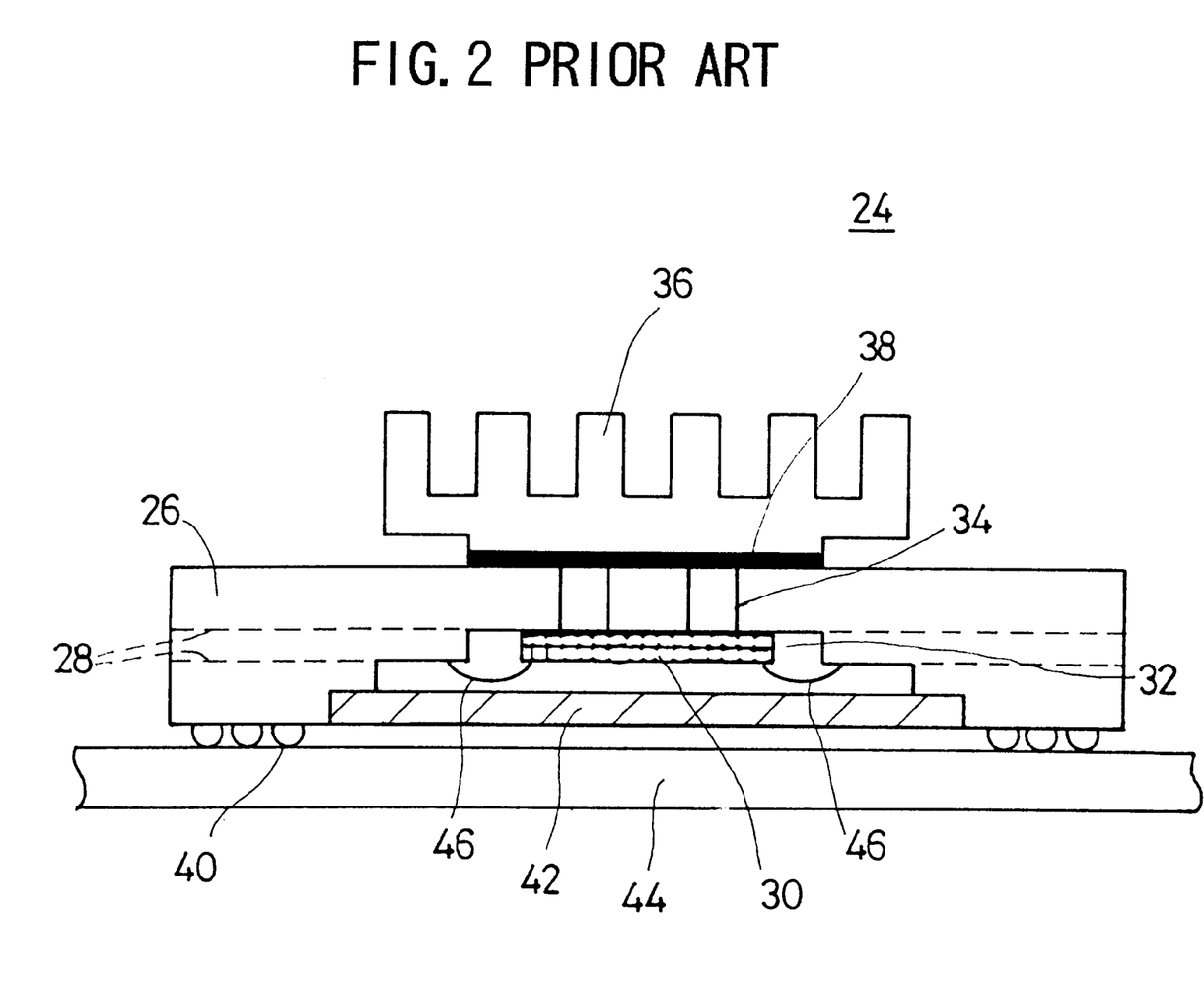
FIG. 2 is a cross-sectional view of another conventional semiconductor device.

FIG. 2 shows a conventional BGA type semiconductor device taking into account heat radiation. A BGA type semiconductor device 24 shown in FIG. 2 includes a semiconductor chip (LSI chip) 30 fastened to a recess portion of a wiring board (which may be referred to as a package or case) 26 by Ag epoxy resin adhesive 32. The wiring board 26 is made of glass epoxy resin, and includes inner wiring layers 28 having a multilayer structure. Each of the wiring layers 28 is, for example, 35 µm thick. The wiring layers 28 are connected to ball-shaped solder bumps 40 through via holes (not shown). The semiconductor chip 30 and the wiring board 26 are bonded together by wires 46. The recess portion that accommodates the semiconductor chip 30 is sealed by a lid 42.

As shown in FIG. 2, thermal vias 34 are provided between the bottom surface of the recess portion of the wiring board 26 and the upper surface thereof. The inner walls of the thermal vias 34 are covered by a metallic material having a high thermal conductivity, such as copper (copper plating). A heat radiating fin 36 is fixed to the upper surface of the wiring board 26 by a silicone adhesive 38 so that the fin 36 covers the thermal vias 34.

However, the conventional BGA type semiconductor device 24 shown in FIG. 2 has a disadvantage in that heat generated by the semiconductor chip 30 can be radiated only through the heat radiating fin 36 and thus effective and efficient heat radiating performance cannot be obtained.

SUMMARY OF THE INVENTION

It is a general object of the present invention to provide a semiconductor device in which the above disadvantage is eliminated.

A more specific object of the present invention is to provide a semiconductor device in which heat emitted from electronic components including a semiconductor chip can be effectively and efficiently radiated.

The above objects of the present invention are achieved by a semiconductor device comprising: a wiring board; an electronic component supported by the wiring board; a heat conduction layer provided in the wiring board so as to be in contact with the electronic component; and terminals provided on the wiring board and thermally connected to the heat conduction layer through thermal vias provided in the wiring board. Heat generated by the electronic component conducts to the terminals through the heat conduction layer and then conducts to a circuit board on which the semiconductor device is placed.

The terminals may include projection electrodes which are to be placed on a circuit board.

The terminals may include ball-shaped electrodes which are to be placed on a circuit board.

The terminals may be located on a peripheral surface portion of the wiring board.

The heat conduction layer may include copper.

The above semiconductor device may further comprise projection electrodes for external connections, the projection electrodes being located on the circuit board.

The projection electrodes may have a shape identical to the terminals.

The above semiconductor device may further comprise a heat radiating member thermally connected to the heat conduction layer through thermal vias provided in the wiring board.

The heat radiating member and the terminals may be located on opposite sides of the wiring layer.

The electronic component may include a semiconductor chip.

The above-mentioned objects of the present invention are also achieved by a semiconductor device comprising: a base functioning as a heat radiating member; an electronic component supported by the base; a flexible circuit board supported by the base and electrically connected to the electronic component; and terminals used for external connections and connected to a circuit pattern of the flexible circuit board.

The flexible circuit board may comprise a plurality of separate flexible circuit boards supported by the base.

The terminals may comprise ball-shaped solder bumps.

The above semiconductor device may further comprise an insulating adhesive layer interposed between the base and the flexible circuit board.

The electronic component may comprise a semiconductor chip.

BRIEF DESCRIPTION OF THE DRAWINGS

The other objects, features and advantages of the present invention will become more apparent from the following detailed description when read in conjunction with the accompanying drawings, in which.

DESCRIPTION OF THE PREFERRED EMBODIMENTS

Figure 3:
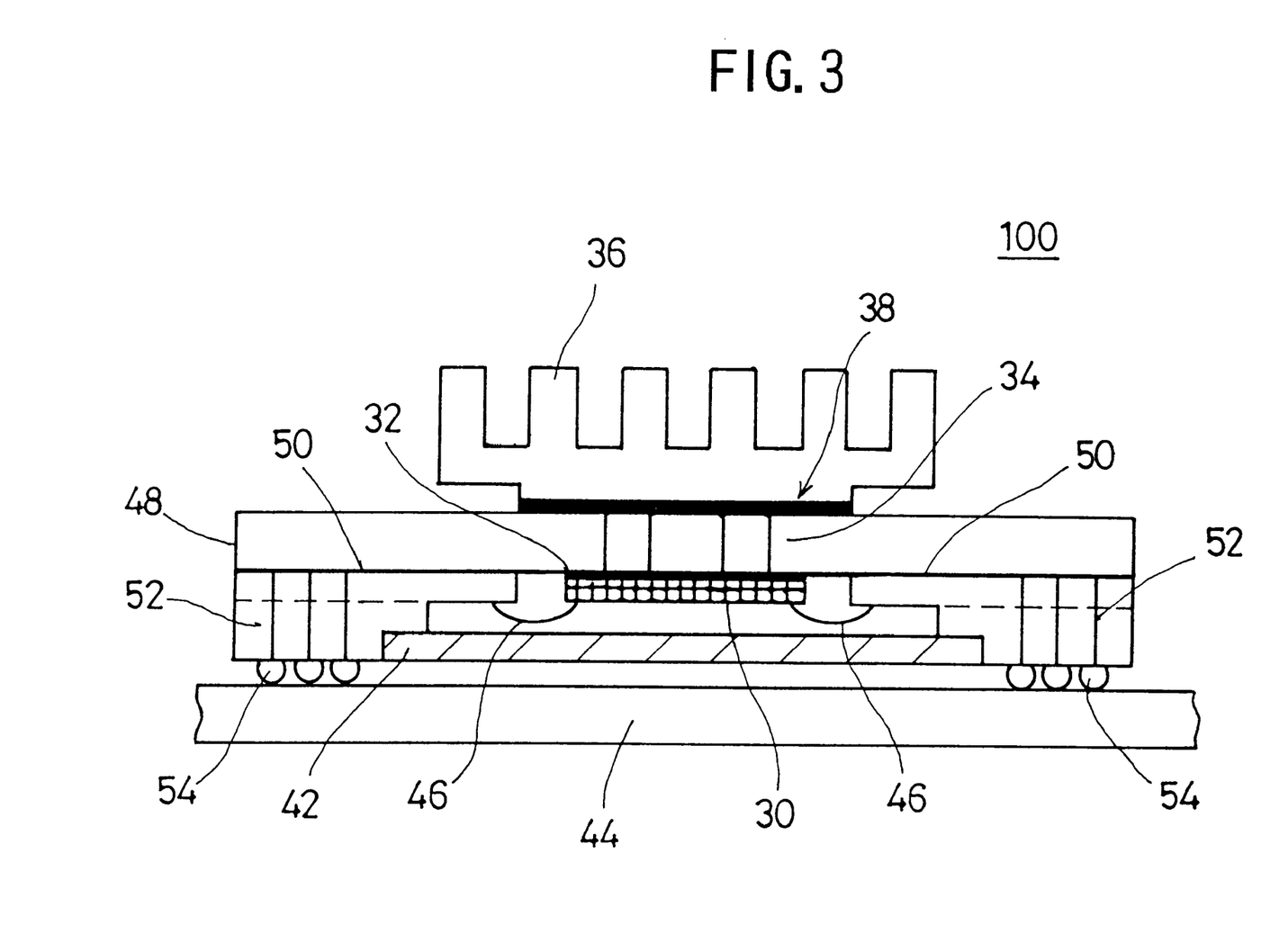
FIG. 3 is a cross-sectional view of a semiconductor device according to a first embodiment of the present invention.

A description will now be given, with reference to FIG. 3, of a first embodiment of the present invention. FIG. 3 is a cross-sectional view of a BGA type semiconductor device 100 according to the first embodiment of the present invention. In FIG. 3, parts that are the same as those shown in FIG. 2 are given the same reference numerals as previously. One of the essential features of the present invention of the first embodiment of the present invention is that the semiconductor device 100 is equipped with a heat radiating structure in which heat emitted from the semiconductor chip 30 can be radiated through not only the heat radiating fins 36 but also a mother board 44.

A wiring board (which can be referred to as a package or case in terms of the function of the wiring board) 48 includes a heat conduction layer 50 provided therein. The heat conduction layer 50 is exposed on the bottom surface of the recess portion having steps formed in the wiring board 48. The heat conduction layer 50 is connected to the copper plating layers of the thermal vias 34. The heat conduction layer 50 is formed of a predetermined thermal conductivity. For example, the heat conduction layer 50 is made of copper. The thickness of the heat conduction layer 50 may be determined taking into consideration the thermal conductivity of the material of the layer 50, the amount of heat emitted from the semiconductor chip 30, the heat radiating capacity of the heat radiating fin 36, the number of ball-shaped solder bumps 54 (which will be described later), and so on. It is preferable that the heat conduction layer 50 is thicker than that of the normal wiring layers. For example, the heat conduction layer 50 made of copper is 75 μm thick.

The semiconductor chip 30 is fixed to the heat conduction layer 50 by the Ag epoxy adhesive 32. A plurality of thermal vias 52 is provided in the peripheral surface portions of the wiring board 48. A copper plating layer or the like is provided in each of the thermal vias 52, and thermally connects the heat conduction layer 50 and the ball-shaped solder bumps (electrodes or terminals) 54 provided on the lower surface of the wiring board 48. The solder bumps 54 are specifically used for heat radiation, and are different from the other solder bumps 54 used to input and output signals. The solder bumps 54 are provided on lands formed on the wiring board 48. However, the lands and the solder bumps 54 are integrally illustrated for the sake of simplicity.

When the semiconductor device 100 thus configured is mounted on the mother board 44 and is operated, the semiconductor chip 30 generates heat. The generated heat is applied to the heat radiation fin 36 through the heat conduction layer 50 and the thermal vias 34, and is applied to the solder bumps 54 through the heat conduction layer 50 and the thermal vias 52. The heat applied to the solder bumps 54 conducts to the mother board 44 and is radiated therefrom. Thus, the semiconductor device 100 has much more effective and efficient heat radiating performance than the conventional semiconductor devices. According to the experiments conducted by the present inventors, it has been confirmed that the heat radiating performance of the semiconductor device 100 is approximately 1.2 times higher than that of the semiconductor device 24 shown in FIG. 2.

Figure 4:
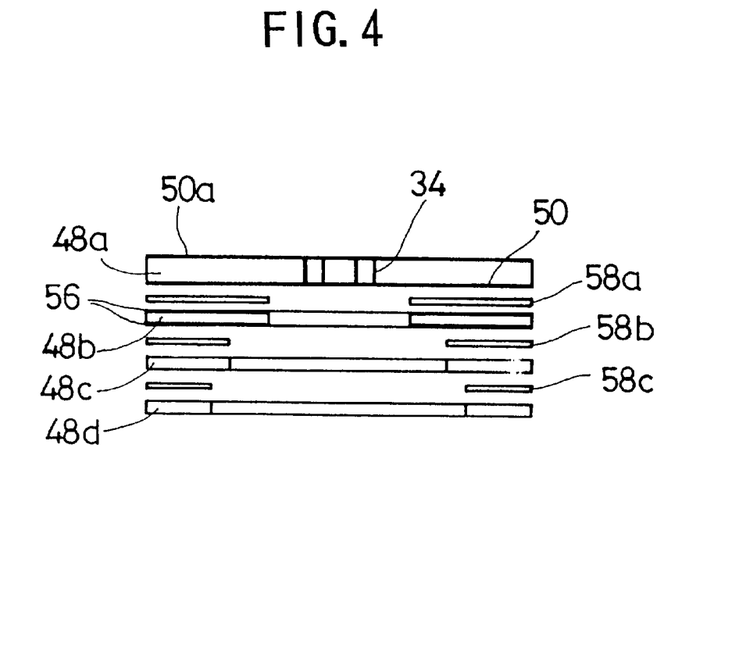
FIG. 4 is a diagram which shows a method for producing a wiring board of the semiconductor device according to the first embodiment of the present invention.
Figure 5:
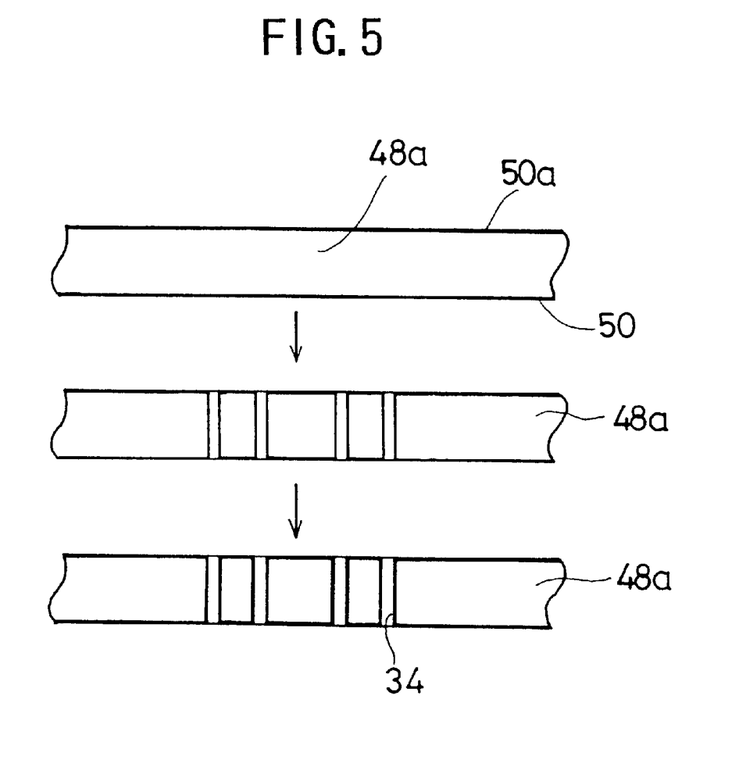
FIG. 5 is another diagram which shows the method shown in FIG. 4.

A method for producing the wiring board 48 shown in FIG. 3 will now be described with reference to FIGS. 4 and 5.

The wiring board 48 includes glass epoxy resin plates 48a, 48b, 48c and 48d arranged in a stacked formation. As shown in FIG. 5, copper layers 50 and 50a are provided on opposite surfaces of the glass epoxy resin plate 48a. Through holes are mechanically formed in the glass epoxy resin plate 48a, and are subjected to a copper plating process. The through holes provided with the copper plating layers function as the aforementioned thermal vias 34. The glass epoxy resin plates 48b, 48c and 48d are stacked so that adhesive resin sheets 58b and 58c are respectively interposed between the stacked plates. Then the thermal vias 52 are formed. Copper patterned layers 56 are provided on the opposite surfaces of the glass epoxy resin plate 48b. Via holes (plated by copper) for transmitting signals are formed in the glass epoxy resin plates 48b, 48c and 48d beforehand. The glass epoxy resin plate 48a is adhered to the glass epoxy resin plates 48b, 48c and 48d arranged in the stacked formation by an adhesive resin sheet 58a.

Figure 6:
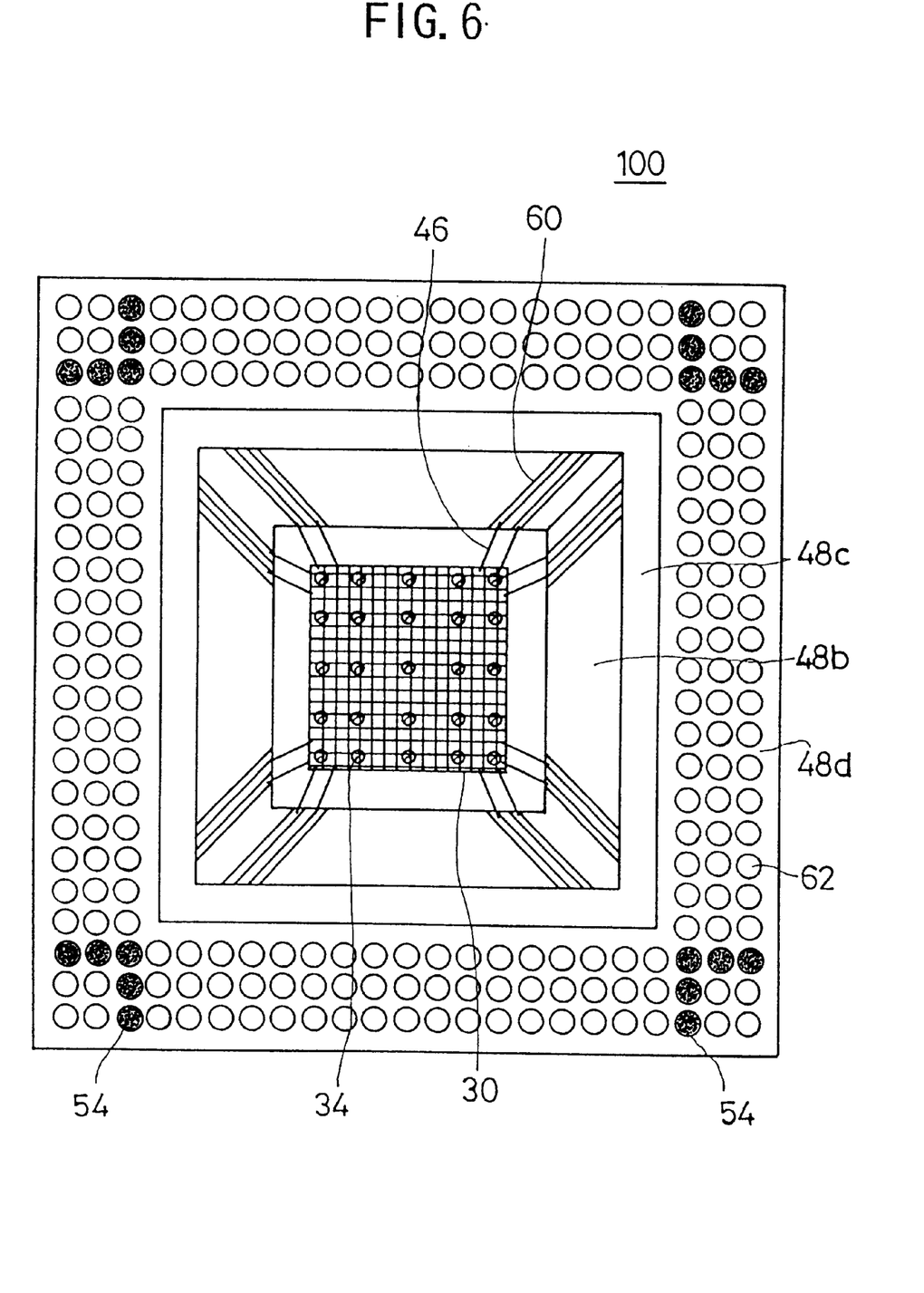
FIG. 6 is a plan view of the semiconductor device according to the first embodiment of the present invention.

FIG. 6 is a bottom view of the semiconductor device 100 with the lid 42 being removed therefrom. In FIG. 6, parts that are the same as shown in the previously described figures are given the same reference numbers as previously. The solder bumps 54 for heat radiation formed on the epoxy resin plate 48d are depicted as filled circles. Other bumps 62 for inputting and/or outputting signals are depicted as circles. The pads provided on the semiconductor chip 30 and the signal input/output bumps 62 are connected together by wiring patterns 60 formed on the glass epoxy resin plate 48b.

The first embodiment of the present invention can be modified in various ways. For example, it may be possible to omit the heat radiating fin 36 and the thermal vias 34.

Figure 7:
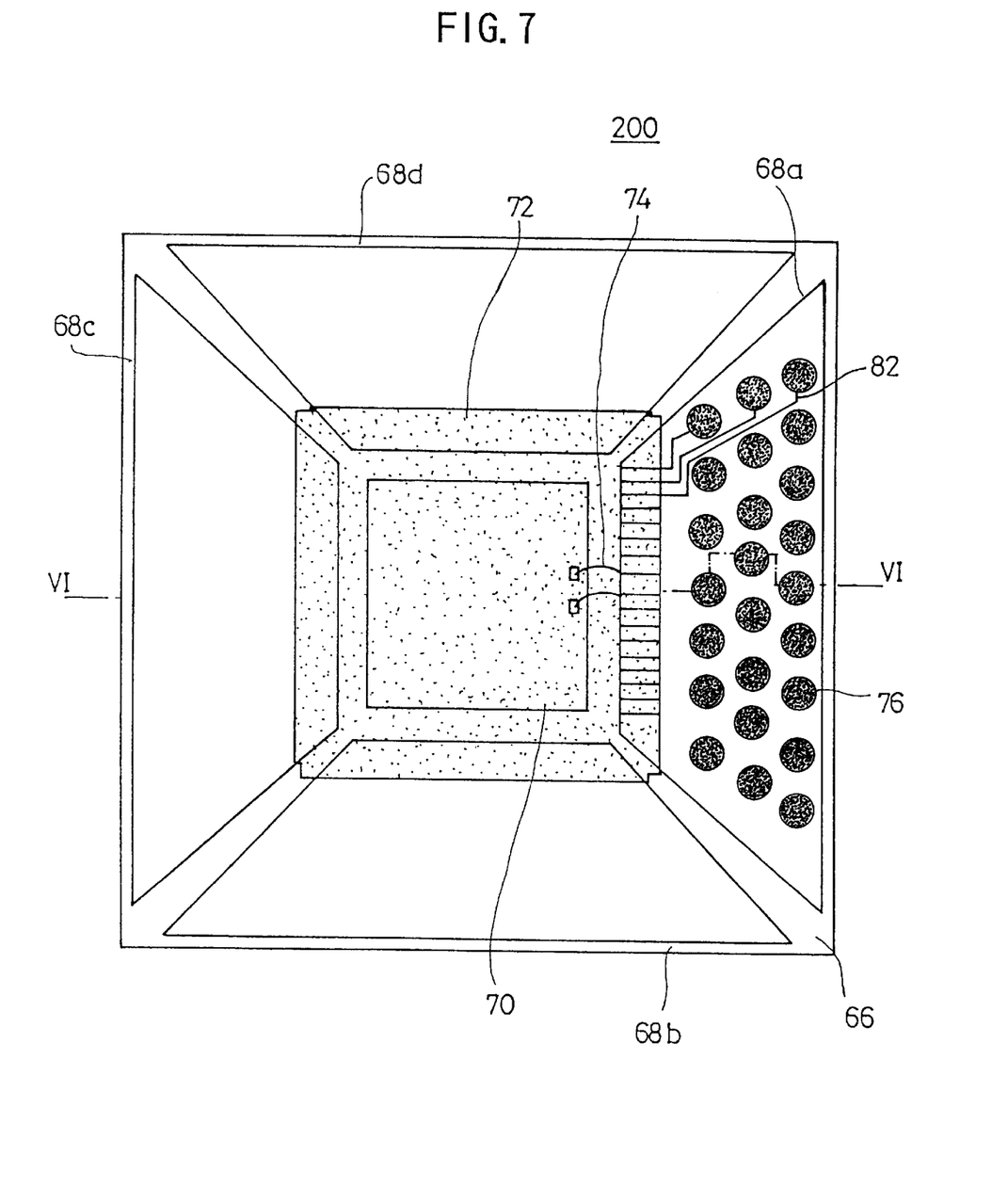
FIG. 7 is a plan view of a semiconductor device according to a second embodiment of the present invention.
Figure 8:
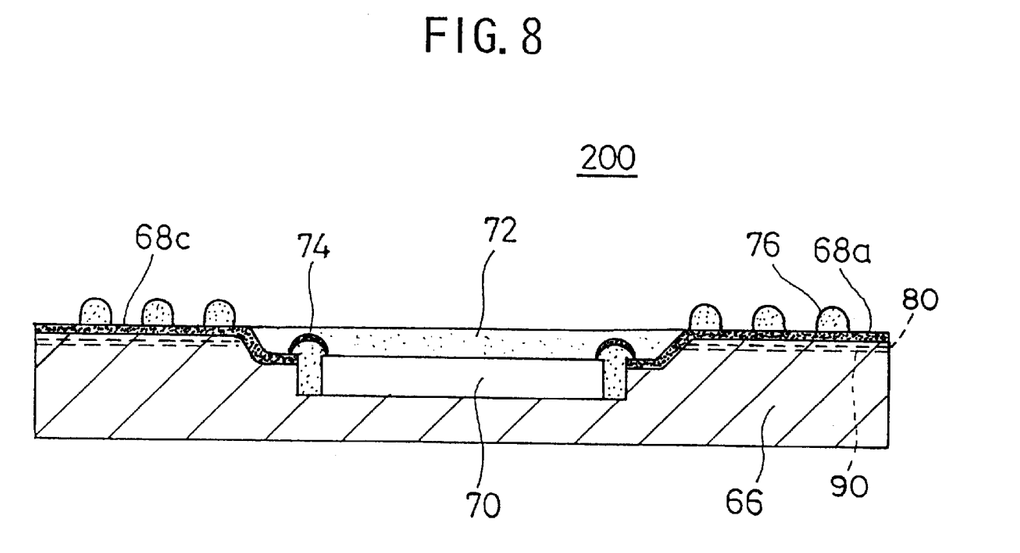
FIG. 8 is a cross-sectional view of the semiconductor device according to the second embodiment of the present invention.

A description will now be given, with reference to FIGS. 7, 8 and 9, of a second embodiment of the present invention.

A BGA type semiconductor device 200 according to the second embodiment of the present invention is directed to overcoming the aforementioned disadvantage of the prior art and has an essential feature in which a base (body) functions as a radiator.

The semiconductor device 200 includes a board or base 66 having a predetermined high thermal conductivity. For example, the base 66 is made of aluminum, which is a suitable substance which includes a desired thermal conductivity and is relatively light and less expensive. Beside aluminum, the base 66 can be made of, for example, copper or magnesium. Beside the metallic materials, the base 66 can be made of ceramics such as alumina, AlN, SiC and SiW.

The upper surface of the base 66 has a recess portion equipped with a step and located in the center of the upper surface. A semiconductor chip 70 is directly fixed to the bottom surface of the recess portion (die bonding). Four flexible circuit boards (or flexible printed circuit boards) 68a, 68b, 68c and 68d are provided on and fixed to the upper surface and step of the base 66 by an adhesive 80 having electrically insulating and high thermal conductivity performance. For example, the adhesive 80 is a layer including an electrically insulating impregnation sheet in which a glass cloth (weaved or not weaved) is impregnated with a heat hardening adhesive such as epoxy resin, imide or ester. Alternatively, it is possible to directly coat the heat-hardening adhesive on the upper surface and step of the base 66. It is also possible to provide a flexible circuit board on the bottom surface of the recess portion of the board 66 in which the semiconductor chip 70 is accommodated, and is fixed thereto by die bonding. However, it may be preferable that the semiconductor chip 70 can be directly attached to the base 66 in terms of heat radiation.

When the base 66 is made of aluminum, it may be preferable that the surface of the base 66 has an alumite state (by an oxidizing process) in order to increase the insulation between the base 66 and the flexible circuit boards 68a, 68b, 68c and 68d. The alumite surface (oxidized surface) of the base 66 is depicted by a broken line indicated by reference number 90. More particularly, the broken line 90 corresponds to an interface between the alumite portion and the aluminum portion of the base 66.

It will be noted that the four separate flexible circuit boards 68a–68d are used so that these circuit boards can be easily deformed so as to match the surface step of the base 66. It is possible to place the four separate flexible circuit boards 68a–68d on the base 66 or to place a single flexible circuit board on the base 66 and divide it into the four parts. The flexible circuit boards 68a–68d and the semiconductor chip 70 are connected together by bonding wires 74.

The flexible circuit boards 68a–68d may include wiring layers only on the surfaces thereof and/or include inner wiring layers located therein.

Figure 9:
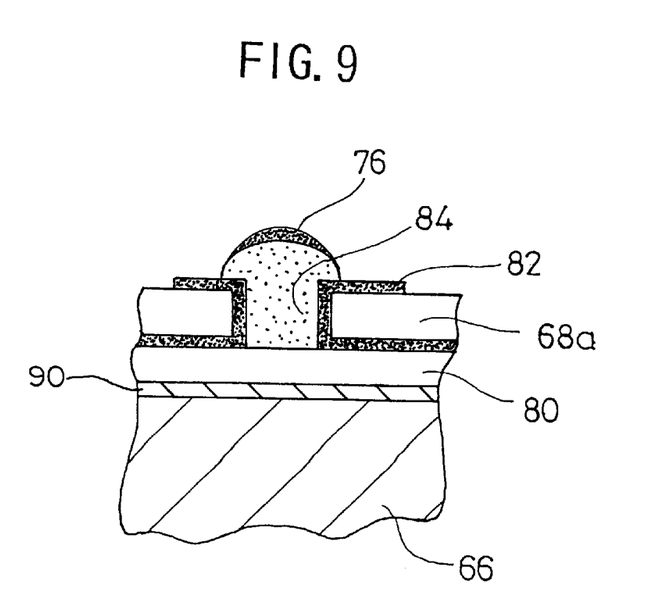
FIG. 9 is an enlarged cross-sectional view of a flexible circuit board used in the second embodiment of the present invention.

FIG. 9 is a diagram showing the detail of the flexible circuit board 68a. The other flexible circuit boards are configured in the same way as the board 68a. The flexible circuit board 68a has a plurality of through holes 84 (only one through hole 84 is illustrated in FIG. 9). A wiring pattern such as a copper layer is formed on the two opposite surfaces of the board 68a and the through hole 84 by, for example, plating. The ball-shaped solder bump 76 is provided so as to cover the through hole 84. The bottom surface of the solder bump 76 is in contact with the insulating adhesive layer 80, and the side portion thereof is electrically connected to the wiring pattern 82 in the through hole 84. The flexible circuit boards 68a–68d are, for example, polyimide films, polyester films, polycarbonate films, or polyamide films. The solder bumps 76 may be eutectic solder, high fusing point solder or low fusing point solder.

The terminals or electrodes on the semiconductor chip 70 and the circuit patterns (terminals or electrodes) on the flexible circuit boards 68a–68d are bonded together by wires. The recess portion of the base 66 including the semiconductor chip 70 is covered by a chip coat 72, as shown in FIG. 8. The upper surface of the chip coat 72 is located at almost the same horizontal level as the surfaces of the flexible circuit boards 68a–68d. The chip coat 72 is made of, for example, epoxy resin, silicone, polyurethane or acrylate resin.

In the semiconductor device 200 thus configured, heat generated from the semiconductor chip 70 conducts to the base 66, through which the heat is radiated. It is possible to provide less-expensive BGA type semiconductor devices having a large degree of freedom in design of wiring patterns by using the flexible circuit boards 68a–68d and the bumps 76 for external connections provided in the through holes 84 in the boards.

In the above-mentioned embodiments of the present invention, the solder bumps are used as the projection electrodes. Alternatively, projection electrodes of another type may be used in lieu of the solder bumps.

The present invention is not limited to the specifically disclosed embodiments, and variations and modifications may be made without departing from the scope of the present invention.

What is claimed is:

1. A semiconductor device comprising:

a wiring board;

an electronic component supported by the wiring board;

a heat conduction layer provided in the wiring board so as to be in contact with the electronic component; and terminals, including ball-shaped electrodes to be placed on a circuit board, provided on the wiring board and thermally connected to the heat conduction layer through thermal vias provided in the wiring board, wherein heat generated by the electronic component conducting to the terminals through the heat conduction layer and then conducting to the circuit board on which the semiconductor device is placed, and wherein said heat conduction layer has no via formed therein through which terminals electrically connected to the electronic component pass.

2. The semiconductor device as claimed in claim 1, wherein said terminals are located on a peripheral surface portion of the wiring board.

3. The semiconductor device as claimed in claim 1, wherein said heat conduction layer comprises copper.

4. The semiconductor device as claimed in claim 1, further comprising projection electrodes for external connections, said projection electrodes being located on the circuit board.

5. The semiconductor device as claimed in claim 4, wherein said projection electrodes have a shape identical to the terminals.

6. The semiconductor device as claimed in claim 1, further comprising a heat radiating member thermally connected to said heat conduction layer through thermal vias provided in the wiring board.

7. The semiconductor device as claimed in claim 6, wherein the heat radiating member and the terminals are located on opposite sides of the wiring layer.

8. The semiconductor device as claimed in claim 1, wherein said electronic component comprises a semiconductor chip.

9. A semiconductor device, comprising:
- a base having a planar upper surface, a recess formed therein, and a step between the upper surface and the recess, said base functioning as a heat radiating member, being made of metal, and including a heat conduction layer and an electrical insulation surface layer as the upper surface integrally formed with the heat conduction layer;
- an adhesive electrical insulation layer formed on the insulation surface layer the step and the recess;
- an electronic component located in the recess on the adhesive electrical insulation layer and thermally contacting the heat conduction layer through the adhesive electrical insulation layer and the base insulation surface layer;
- a flexible circuit board connected to the upper surface and the step by the adhesive insulation layer, and electrically connected to the electronic component; and
- terminals, including ball-shaped solder bumps, used for external connections and connected to a circuit pattern of the flexible circuit board, wherein said heat conduction layer does not have any vias formed therein through which terminals connected to the electronic component pass.

10. The semiconductor device as claimed in claim 9, wherein said flexible circuit board comprises a plurality of separate flexible circuit boards.

11. The semiconductor device as claimed in claim 9, wherein said electronic component comprises a semiconductor chip.

12. The semiconductor device as claimed in claim 9, wherein the flexible circuit board is segmented into a plurality of parts separated from each other.

\* \* \* \* \*